US012671381B2

(12) United States Patent
Nishimura

(10) Patent No.: US 12,671,381 B2
(45) Date of Patent: Jun. 30, 2026

(54) AMPLIFIER CIRCUIT WITH TWO-TERMINAL SYNTHESIS RESISTOR AS FEEDBACK RESISTOR

(71) Applicant: Analog Devices International Unlimited Company, Limerick (IE)

(72) Inventor: Naoaki Nishimura, Tokyo (JP)

(73) Assignee: Analog Devices International Unlimited Company, Limerick (IE)

( * ) Notice: Subject to any disclaimer, the term of this patent is extended or adjusted under 35 U.S.C. 154(b) by 500 days.

(21) Appl. No.: 18/465,877

(22) Filed: Sep. 12, 2023

(65) Prior Publication Data

US 2025/0088155 A1 Mar. 13, 2025

(51) Int. Cl.
*H03F 3/45* (2006.01)
*H03F 1/34* (2006.01)

(52) U.S. Cl.
CPC ......... *H03F 3/45475* (2013.01); *H03F 1/342* (2013.01); *H03F 3/45273* (2013.01); *H03F 2203/45528* (2013.01)

(58) Field of Classification Search
CPC .. H03F 3/45475; H03F 1/342; H03F 3/45273; H03F 2203/45528
USPC .................................................. 330/252–261
See application file for complete search history.

(56) References Cited

U.S. PATENT DOCUMENTS

| | | | |
|---|---|---|---|
| 8,305,140 B1 | 11/2012 | Chen et al. | |
| 9,660,592 B2 * | 5/2017 | Takase | H03H 11/53 |
| 2016/0020734 A1 | 1/2016 | Takase | |
| 2019/0081625 A1 | 3/2019 | Rostaing et al. | |
| 2025/0088155 A1 | 3/2025 | Nishimura | |

OTHER PUBLICATIONS

Crescentini et al., "Noise Limits of CMOS Current Interfaces for Biosensors: A Review", IEEE Transactions on Biomedical Circuits and Systems, vol. 8, No. 2, May 23, 2014, 15 pages.
International Search Report received for PCT Patent Application No. PCT/EP2024/070188, mailed on Oct. 17, 2024, 4 pages.

* cited by examiner

*Primary Examiner* — Hieu P Nguyen
(74) *Attorney, Agent, or Firm* — ArentFox Schiff LLP

(57) ABSTRACT
An amplifier circuit includes a first operational amplifier (op amp) and a two-terminal synthesis resistor connected across a non-inverting input of the first op amp and an output of the first op amp. The two-terminal synthesis resistor includes a second op amp. The two-terminal synthesis resistor includes a current mirror having a first transistor, a second transistor, and a common node connected to the first transistor, the second transistor, and an output of the second op amp. The two-terminal synthesis resistor includes a resistor having a first side configured to be a first terminal of the two-terminal synthesis resistor, and a second side connected to an inverting input of the second op amp, and the first transistor. The two-terminal synthesis resistor includes a second terminal of the two-terminal synthesis resistor connected to the second transistor, and a non-inverting input of the second op amp.

44 Claims, 11 Drawing Sheets

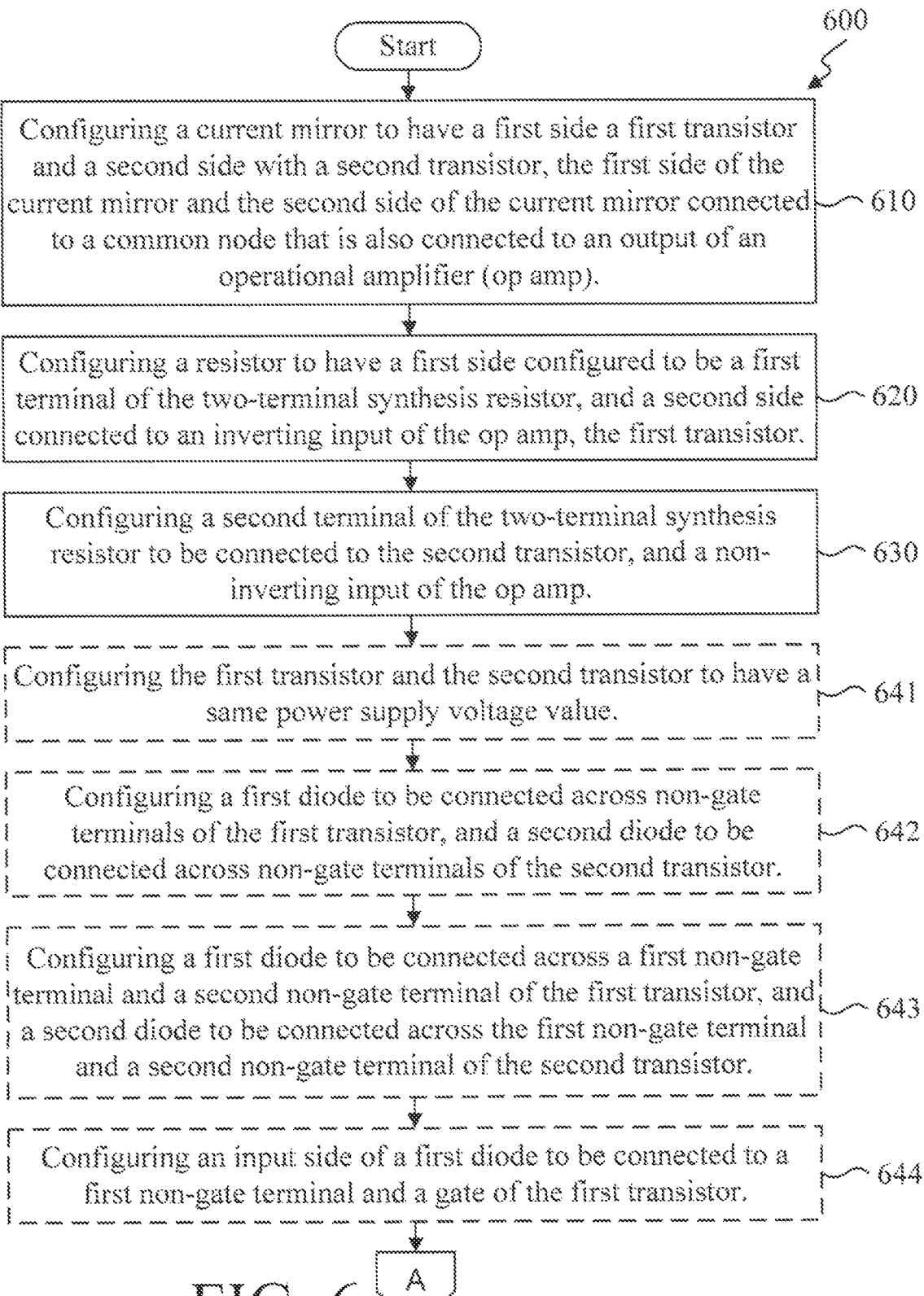

Start

600

Configuring a current mirror to have a first side a first transistor and a second side with a second transistor, the first side of the current mirror and the second side of the current mirror connected to a common node that is also connected to an output of an operational amplifier (op amp).

610

Configuring a resistor to have a first side configured to be a first terminal of the two-terminal synthesis resistor, and a second side connected to an inverting input of the op amp, the first transistor.

620

Configuring a second terminal of the two-terminal synthesis resistor to be connected to the second transistor, and a non-inverting input of the op amp.

630

Configuring the first transistor and the second transistor to have a same power supply voltage value.

641

Configuring a first diode to be connected across non-gate terminals of the first transistor, and a second diode to be connected across non-gate terminals of the second transistor.

642

Configuring a first diode to be connected across a first non-gate terminal and a second non-gate terminal of the first transistor, and a second diode to be connected across the first non-gate terminal and a second non-gate terminal of the second transistor.

643

Configuring an input side of a first diode to be connected to a first non-gate terminal and a gate of the first transistor.

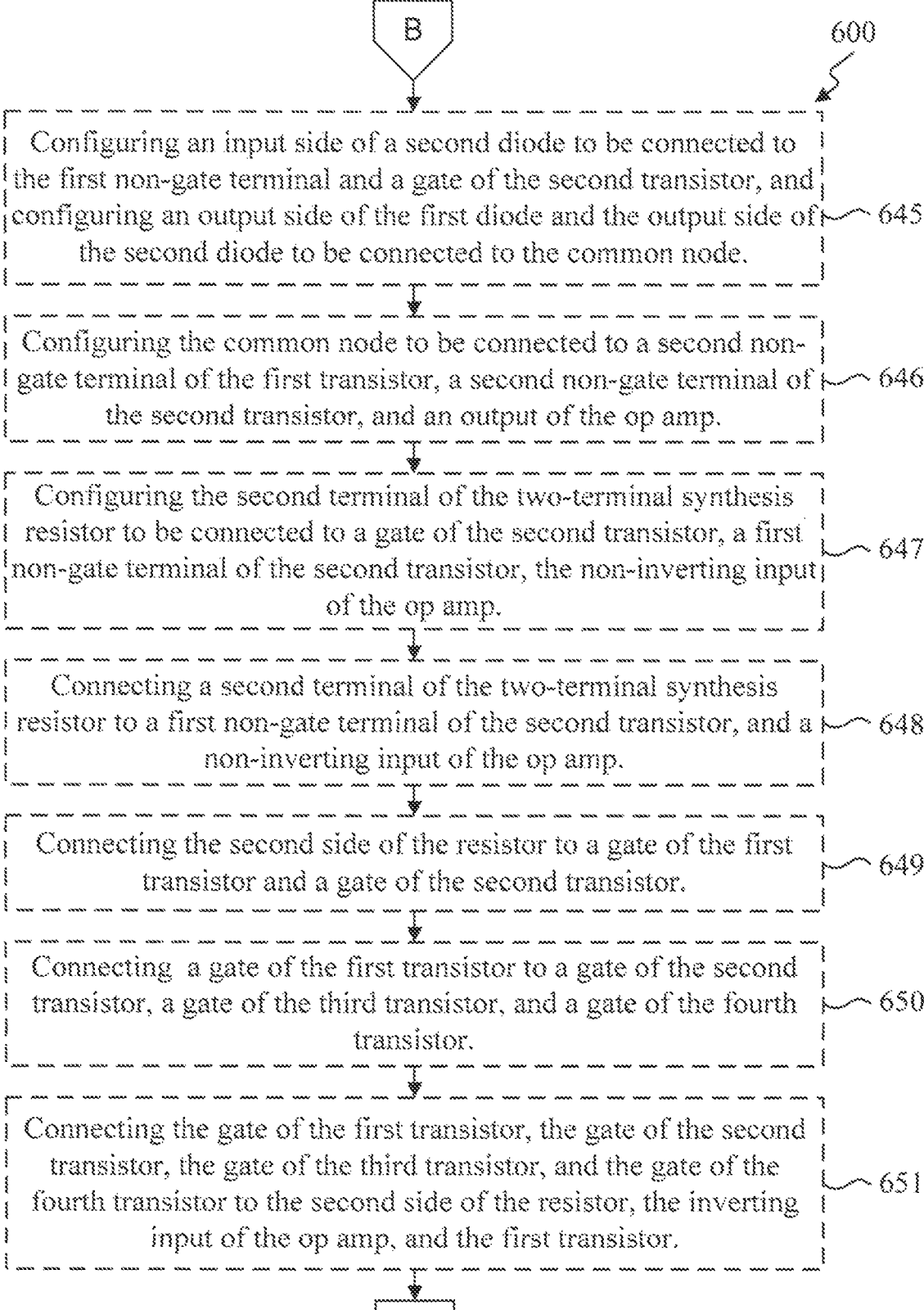

B

600

Configuring an input side of a second diode to be connected to the first non-gate terminal and a gate of the second transistor, and configuring an output side of the first diode and the output side of the second diode to be connected to the common node. — 645

Configuring the common node to be connected to a second non-gate terminal of the first transistor, a second non-gate terminal of the second transistor, and an output of the op amp. — 646

Configuring the second terminal of the two-terminal synthesis resistor to be connected to a gate of the second transistor, a first non-gate terminal of the second transistor, the non-inverting input of the op amp. — 647

Connecting a second terminal of the two-terminal synthesis resistor to a first non-gate terminal of the second transistor, and a non-inverting input of the op amp. — 648

Connecting the second side of the resistor to a gate of the first transistor and a gate of the second transistor. — 649

Connecting a gate of the first transistor to a gate of the second transistor, a gate of the third transistor, and a gate of the fourth transistor. — 650

Connecting the gate of the first transistor, the gate of the second transistor, the gate of the third transistor, and the gate of the fourth transistor to the second side of the resistor, the inverting input of the op amp, and the first transistor. — 651

Connecting a first non-gate terminal of the first transistor to a first non-gate terminal of the third transistor, the second side of the resistor, the inverting input of the op amp, the gate of the first transistor, the gate of the second transistor, the gate of the third transistor, and the gate of the fourth transistor. ⌐652

Configuring a second non-gate terminal of the first transistor, a second non-gate terminal of the second transistor, a second non-gate terminal of the third transistor, and a second non-gate terminal of the fourth transistor to be connected to the common node and the output of the op amp. ⌐653

Configuring the op amp, the current mirror, the resistor, and the output node to form a two-terminal synthesis resistor stage in a plurality of cascaded two-terminal synthesis resistors. Only a first one of the plurality of cascaded two-terminal resistors includes the resistor and remaining ones of the plurality of cascaded two-terminal synthesis resistors omit the resistor. ⌐654

Configuring an output node of a preceding one of the plurality of cascaded two-terminal synthesis resistors to be connected to an input node of a next one of the plurality of cascaded two-terminal synthesis resistors. ⌐655

Configuring the plurality of cascaded two-terminal synthesis resistors to include an even number of stages to combine a current having a current direction from one stage of the plurality of cascaded two-terminal synthesis resistors with a current having an opposing direction from a next stage of the plurality of cascaded two-terminal synthesis resistors. ⌐656

FIG. 8

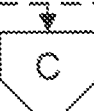

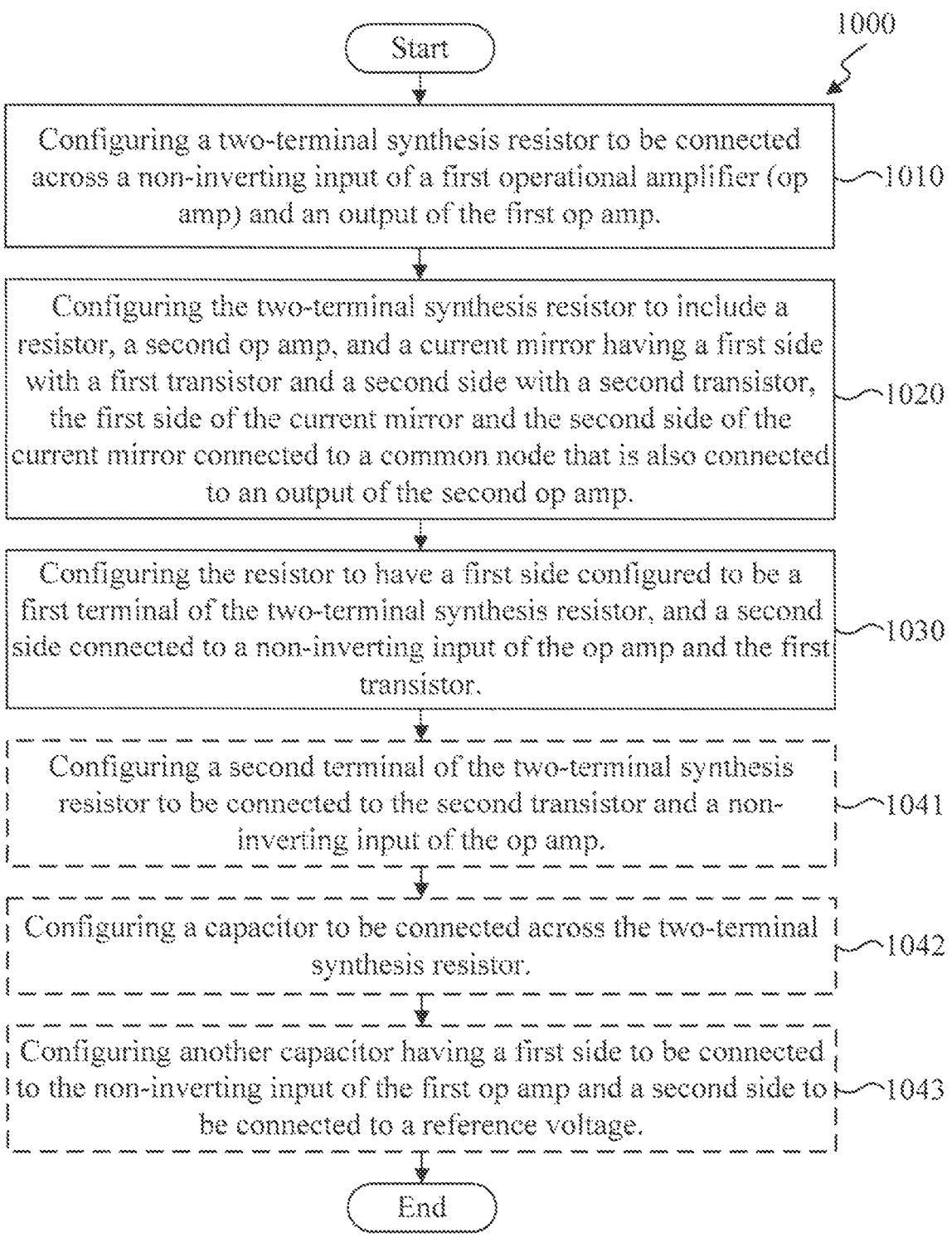

Start

Configuring a two-terminal synthesis resistor to be connected across a non-inverting input of a first operational amplifier (op amp) and an output of the first op amp. ⟿1010

Configuring the two-terminal synthesis resistor to include a resistor, a second op amp, and a current mirror having a first side with a first transistor and a second side with a second transistor, the first side of the current mirror and the second side of the current mirror connected to a common node that is also connected to an output of the second op amp. ⟿1020

Configuring the resistor to have a first side configured to be a first terminal of the two-terminal synthesis resistor, and a second side connected to a non-inverting input of the op amp and the first transistor. ⟿1030

Configuring a second terminal of the two-terminal synthesis resistor to be connected to the second transistor and a non-inverting input of the op amp. ⟿1041

Configuring a capacitor to be connected across the two-terminal synthesis resistor. ⟿1042

Configuring another capacitor having a first side to be connected to the non-inverting input of the first op amp and a second side to be connected to a reference voltage. ⟿1043

End

FIG. 10

AMPLIFIER CIRCUIT WITH TWO-TERMINAL SYNTHESIS RESISTOR AS FEEDBACK RESISTOR

BACKGROUND

This disclosure relates generally to amplifier circuits, more particularly, to a two-terminal resistor.

Using capacitance as a feedback element in amplification circuits for Alternating Current (AC) signals, such as audio signals, or for small currents from sensors, can lower noise than when feedback is done with resistors. Most of the signal band of interest will pass through the capacitance, but a resistor connected in parallel with the feedback capacitance must be used to define the (Direct Current) DC operating point. The higher the value of this DC feedback resistance, the lower noise can be achieved. This is because the noise current generated by the resistor is inversely proportional to the root of the resistance value, that is equal to $$\frac{1}{\sqrt{R}}.$$

However, if the resistance value is too high, the DC operating point will be shifted due to leakage current.

To achieve the noise level required for audio signal processing with a capacitance of a few tens of picofarad (pF), which is feasible on an integrated circuit, a resistance value of tens of Giga ohms to several tera ohms is required. In addition, the leakage resistance component of the Metal-Insulator-metal (MIM) capacitance can drop to several tera ohms in certain process corners, making it difficult to set a resistance value that satisfies both noise and DC stability.

To solve this problem, a circuit has been proposed to increase the equivalent resistance by decreasing the current through the resistive elements with a current mirror. By decreasing the current through the resistive element by $$\frac{1}{N},$$

the effective resistance is increased by a factor of N.

The noise current generated by the resistive element is also multiplied by $$\frac{1}{N},$$

and thus becomes equal to the noise current generated by $N^2$ times the resistor (recall that the noise current is inversely proportional to the root of the resistance value). Since the magnification factor N is determined by the dimensional ratio of the current mirror, it is stable with respect to process, voltage, and temperature.

However, a conventional synthesized resistor realized with a current mirror behaves like an Operational Transconductance Amplifier (OTA), which outputs a current from one terminal proportional to the potential difference between the terminal on one side and a reference voltage on the other side. The conversion from voltage to current is done only in one direction, and voltage information from the other side is not correctly reflected in the current value. For this reason, it can only be used in amplifiers such as inverting amplifiers, where the potential on the summing node side of the feedback device is fixed to the reference voltage by an imaginary short.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

According to other aspect of the present disclosure, an amplifier circuit is provided. The amplifier circuit includes a first operational amplifier (op amp). The amplifier circuit further includes a two-terminal synthesis resistor connected across a non-inverting input of the first op amp and an output of the first op amp. The two-terminal synthesis resistor includes a second op amp. The two-terminal synthesis resistor further includes a current mirror having a first transistor, a second transistor, and a common node. The common node is connected to the first transistor, the second transistor, and an output of the second op amp. The two-terminal synthesis resistor also includes a resistor having a first side configured to be a first terminal of the two-terminal synthesis resistor, and a second side connected to an inverting input of the second op amp, and the first transistor. The two-terminal synthesis resistor additionally includes a second terminal of the two-terminal synthesis resistor connected to the second transistor, and a non-inverting input of the second op amp.

According to still further aspects of the present invention, a method for forming an amplifier circuit is provided. The method includes configuring a two-terminal synthesis resistor to be connected across a non-inverting input of a first operational amplifier (op amp) and an output of the first op amp. The method further includes configuring the two-terminal synthesis resistor to include a resistor, a second op amp, and a current mirror having a first side with a first transistor and a second side with a second transistor, the first side of the current mirror and the second side of the current mirror connected to a common node that is also connected to an output of the second op amp. The method also includes configuring the resistor to have a first side configured to be a first terminal of the two-terminal synthesis resistor, and a second side connected to an inverting input of the op amp, the first transistor. The method additionally includes configuring a second terminal of the two-terminal synthesis resistor to be connected to the second transistor and a non-inverting input of the first op amp.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, wherein dashed lines may indicate optional elements, and in which:

FIGS. 6-9 are flow diagrams of an example method for forming a two-terminal synthesis resistor is shown, in accordance with an example aspect.

FIG. 10 is a flow diagram of an example method for forming a non-inverting amplifier circuit is shown, in accordance with an example aspect.

DETAILED DESCRIPTION

Figure 1:
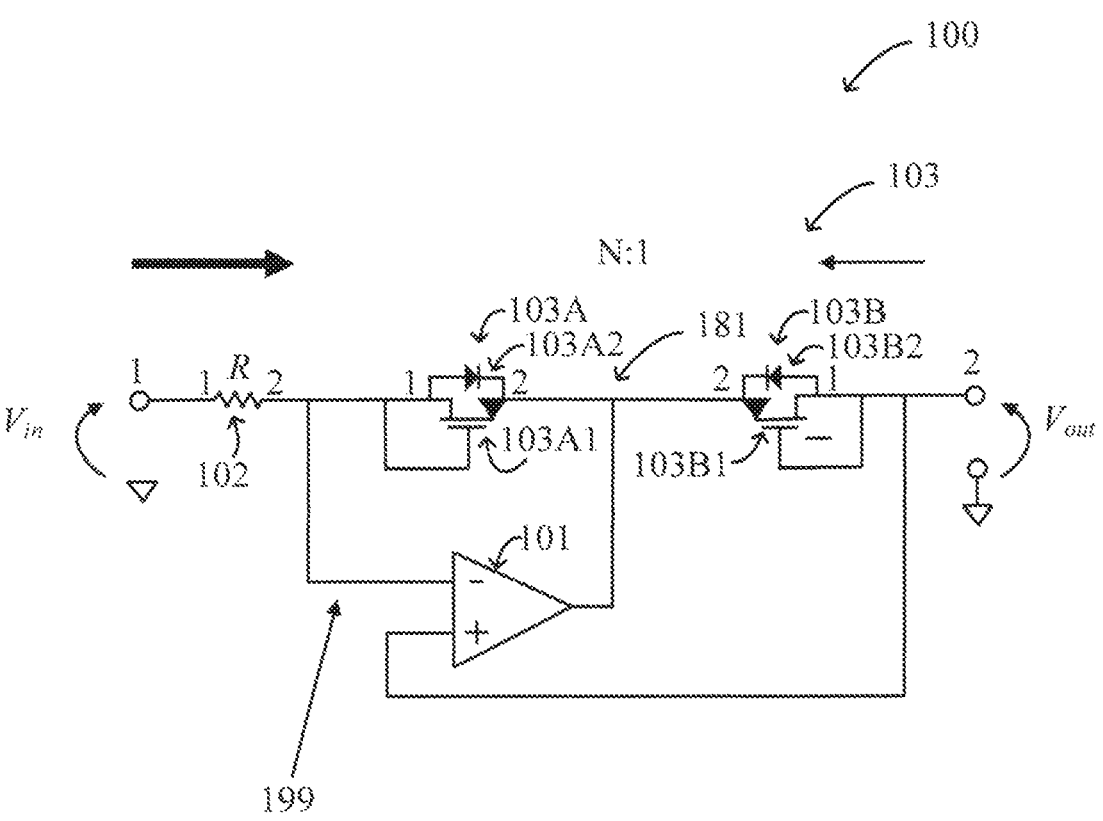
FIG. 1 is a schematic diagram of an example two-terminal synthesis resistor 100, in accordance with an example aspect.

Aspects of the present disclosure are directed to an amplifier circuit having a two-terminal synthesis resistor as a feedback resistor.

A two-terminal synthesis resistor, which achieves a noise equivalent value of more than 1 tera ohm and can correctly reflect the potential of both terminals in the current value, is realized in an ordinal Complementary Metal Oxide Semiconductor (CMOS) process. The proposed two-terminal synthesis resistor can reflect the potential of either terminal or both terminals in the current value, compared to a conventional synthesis resistor, which only reflects the potential of one of the terminals in the current value. The proposed two-terminal synthesis resistor achieves this feature regarding potential reflection by exploiting the virtual short circuit that exists between the inputs of an operational amplifier that is used as part of the proposed two-terminal synthesis resistor. A virtual short-circuit (or simply virtual short) refers to a condition of a differential input amplifier such as an op-amp in which its noninverting and inverting inputs have almost the same voltage. This condition is called a virtual short-circuit because the differential inputs have the same voltage even though they are not connected together. This condition is met when a negative-feedback circuit is formed using a differential amplifier with a high open-loop gain. Therefore, the proposed synthesis resistor can also be used as a feedback element in circuits such as non-inverting amplifiers, where both the input and output potentials vary with respect to a reference potential, allowing more flexible circuit configuration.

This disclosure is an advancement of the conventional circuit, and since the potential of either or both terminals can be correctly reflected in the current value, the described two-terminal synthesis resistor can be connected between any two points, increasing the degree of freedom in circuit design. Additionally, the described two-terminal synthesis resistor can also be used for non-inverting amplifiers.

In various aspects, one side of a current mirror is used in the negative feedback path in an operational amplifier circuit. A current mirror is a circuit designed to copy a current through one active device of a circuit by controlling the current in another active device of the circuit, keeping the output current constant regardless of loading. The current being "copied" can be, and sometimes is, a varying signal current. With respect to the two-terminal synthesis resistor, the current through one or more transistors on one side of the current mirror is copied by controlling the current in one or more other transistors on the other side of the current mirror. The output current may be kept constant and/or otherwise controlled to bias the active elements (the transistors on both side of the current mirror) accordingly to maintain a consistent and/or controllable resistance value for a given application such as the described use in the negative feedback path in an op amp circuit in order to provide a resistance with a significantly high resistance value in the tera ohms. The copied current may be a fraction of the original current based on the value of N as described herein.

Figure 2:
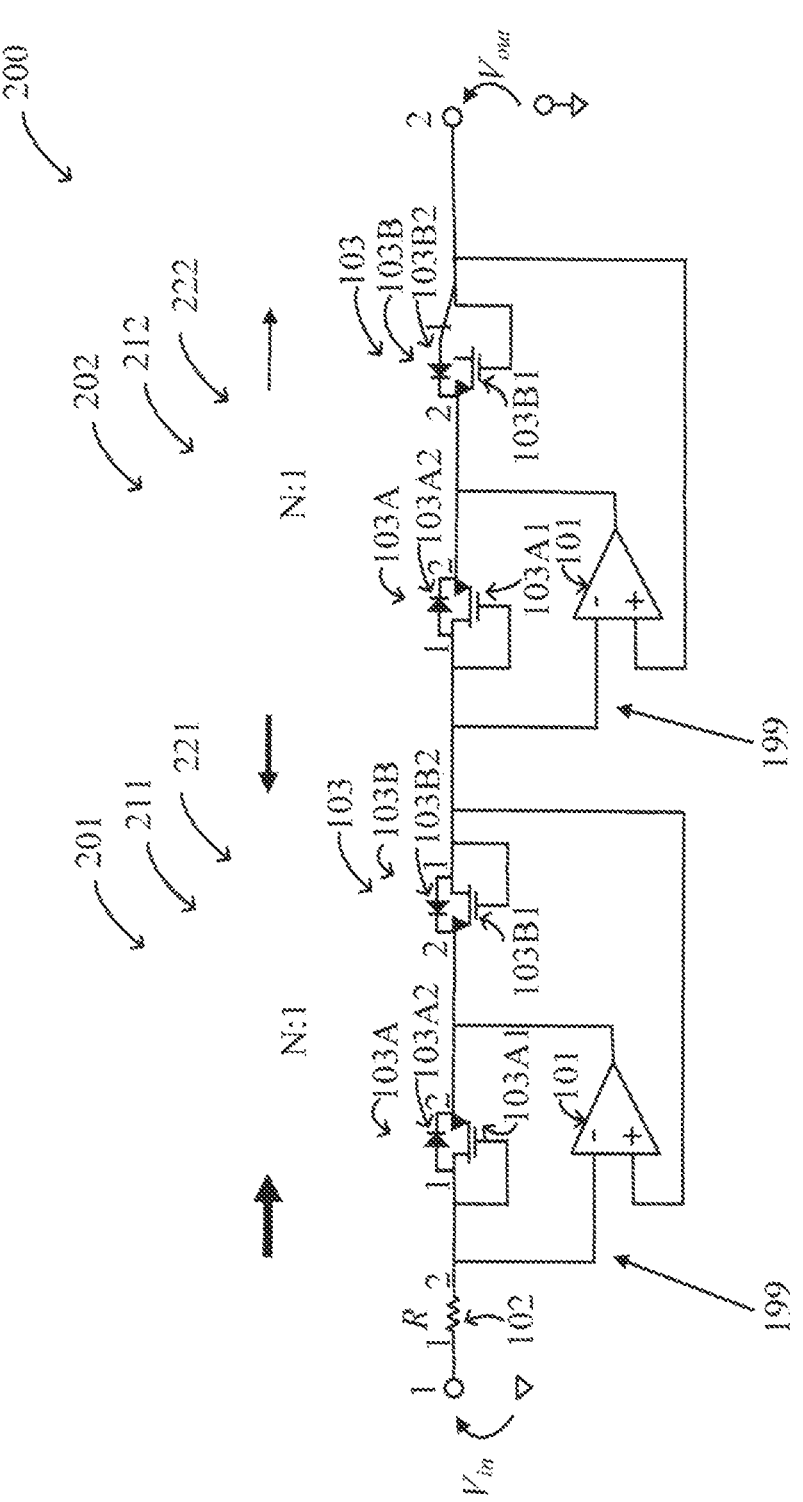
FIG. 2 is a schematic diagram of an example of a cascade of the two-terminal synthesis resistor of FIG. 1, in accordance with an example aspect.

FIG. 1 shows an example two-terminal synthesis resistor 100, FIG. 2 shows the two-terminal synthesis resistor 100 of FIG. 1

Referring to FIG. 1, an example two-terminal synthesis resistor 100 is shown, in accordance with an example aspect. Initially, a description of the top-level components (op amp, current mirror having two transistor circuits, and resistor) is provided, followed by a further description of the connections of these elements and any further constituent components.

The two-terminal synthesis resistor 100 includes an operational amplifier ("op amp") 101, a resistor R 102, and a current mirror 103 formed from a first transistor circuit 103A and a second transistor circuit 103B. The two-terminal synthesis resistor 100 connects to an input voltage $V_{in}$ to provide an output voltage $V_{out}$. The first transistor circuit 103A can be considered to be a first side of the current mirror 103, and the second transistor circuit 103B can be considered to be a second side of the current mirror 103. The preceding circuit elements including, for example, op amp 101 and the negative-feedback circuit formed from the first transistor circuit 103A (i.e., the first side of the current mirror 103), enable the potential of one terminal or both terminals of the two-terminal synthesis resistor 100 to be reflected in the current by virtue of the virtual short that exists between the inputs of op amp 101.

The first transistor circuit 103A includes a first MOSFET 103A1 and a first diode 103A2. The first MOSFET 103A1 includes a gate terminal connected to a first non-gate terminal of MOSFET 103A1, an inverting input terminal of the op amp 101, an input of first diode 103A2, and a second side of resistor R 102. A first side of resistor R 102 is connected to input voltage $V_{in}$.

The second transistor circuit 103B includes a second MOSFET 103B1 and a second diode 103B2. The second MOSFET 103B 1 includes a gate terminal connected to a first non-gate terminal of MOSFET 103B1, a non-inverting input terminal of the op amp 101, an input of second diode 103B, and output voltage $V_{out}$.

The MOSFET 103A1 has a second non-gate terminal connected to an output of the op amp 101, a second non-gate terminal of MOSFET 103B1, an output of first diode 103B1, and an output of second diode 103B2.

The two-terminal synthesis resistor 100 copies the output voltage $V_{out}$ to the right end of resistor R 102 by a virtual short-circuit 199. The virtual short-circuit (or "simply virtual short") 199 refers to a condition of a differential input amplifier such as an op-amp in which its noninverting and inverting inputs have almost the same voltage even though they are not connected together.

The MOSFET absolute maximum voltage between Drain and Source (VDS) of both MOSFET 103A1 and MOSFET 103B1 are configured to be the same value.

The input current, $i_n$, flowing through resistor R 120 is determined as follows:

$$i_n = \frac{V_{in} - V_{out}}{R}$$

The output current, $i_{out}$, is proportional to $V_{in} - V_{out}$ as follows:

$$i_{out} = -\frac{i_{in}}{N} = -\frac{V_{in} - V_{out}}{NR}$$

where N denotes a multiplier between die or transistor sizes of 103A1 versus 103B.

Referring to FIG. 2, an example a cascade 200 of the two-terminal synthesis resistor 100 of FIG. 1 is shown, in accordance with an example aspect.

Each two-terminal synthesis resistor 100 of FIG. 1 can be considered to form a stage of the cascade 200, with only the first stage including the resistor R 102 as shown. This is true irrespective of the number of stages. It is noted that while two stages are shown for the sake of illustration, any number of stages can be used. Since resistances in series add, thus, the cascading of multiple two-terminal synthesis resistors 200 allows for even greater resistance values than can be achieved using a single two-terminal synthesis resistor 100. Thus, any applications that require greater than, for example, a tera ohm, can involve a cascade of two-terminal synthesis resistors to achieve a desired higher resistance.

Figure 4:
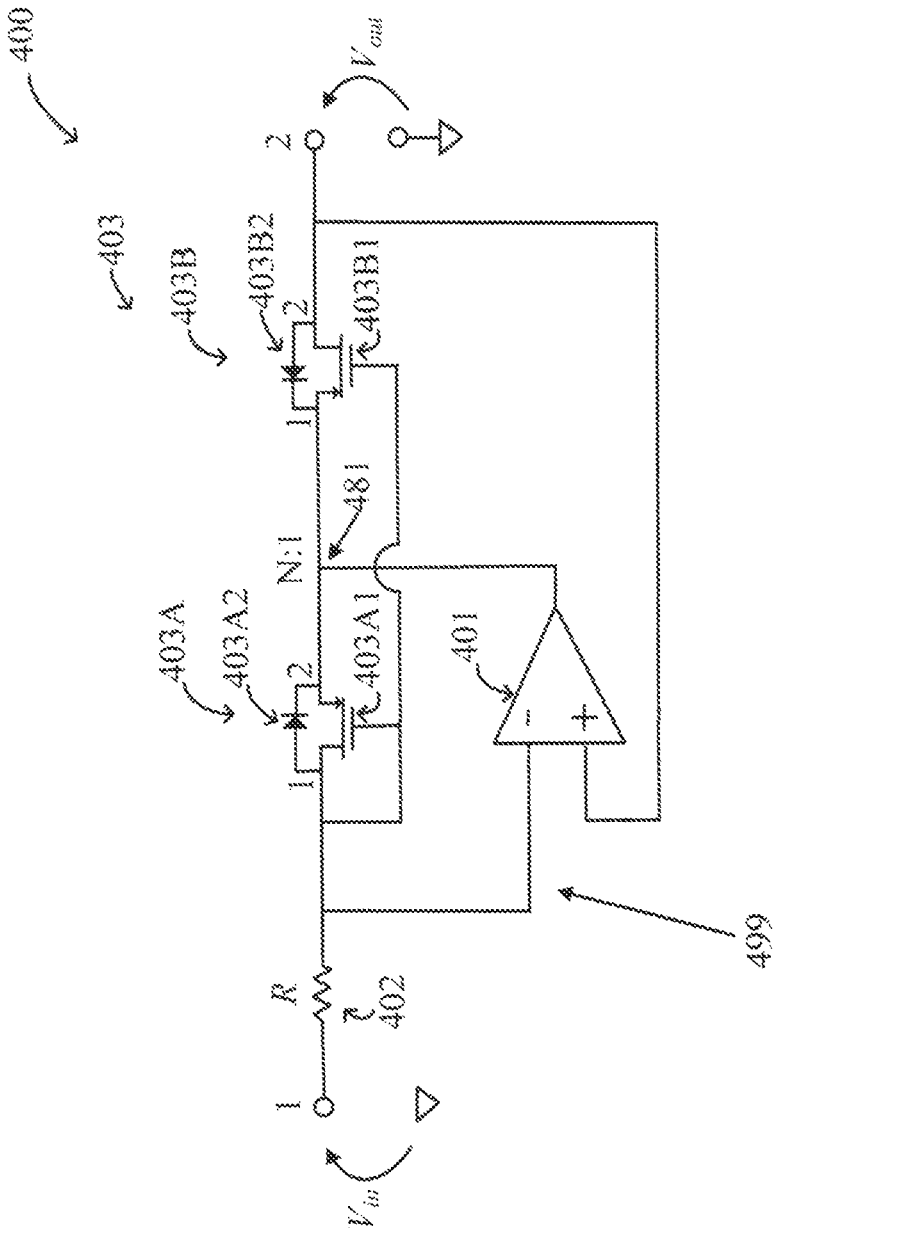
FIG. 4 is a schematic diagram of another example two-terminal synthesis resistor, in accordance with an example aspect.
Figure 5:
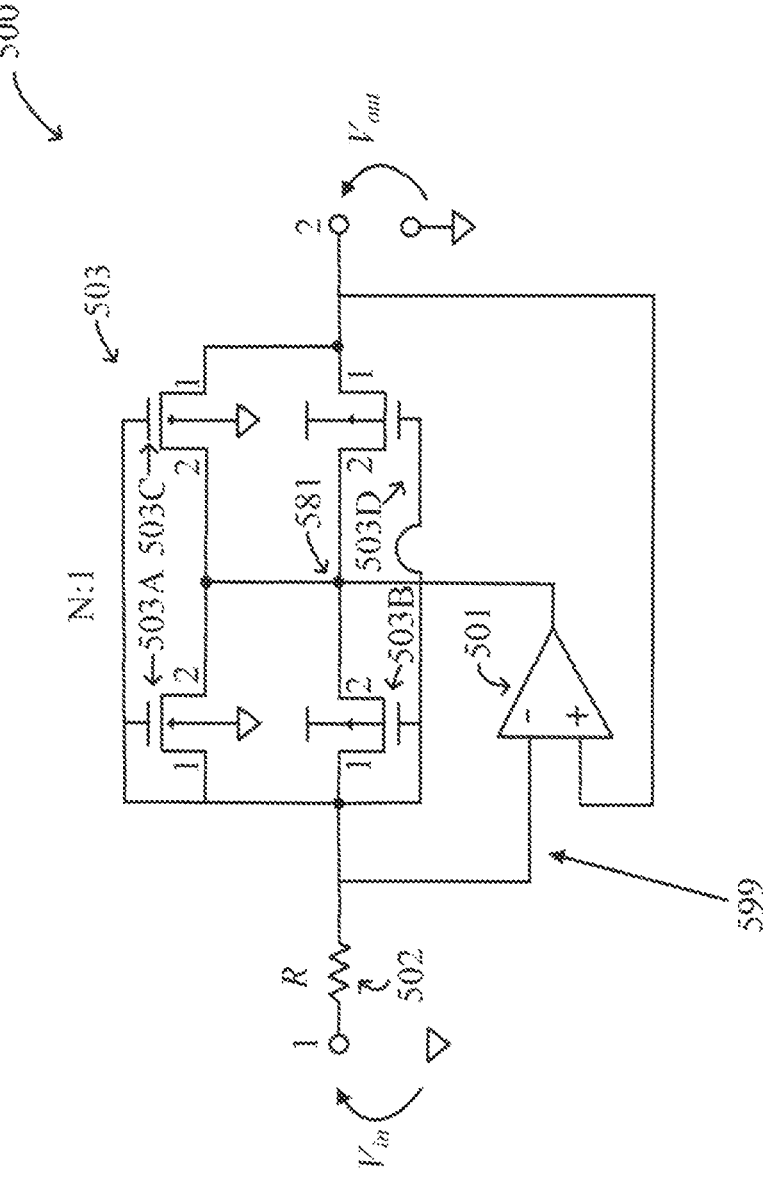
FIG. 5 is a schematic diagram of yet another example two-terminal synthesis resistor, in accordance with an example aspect.
Figure 9:
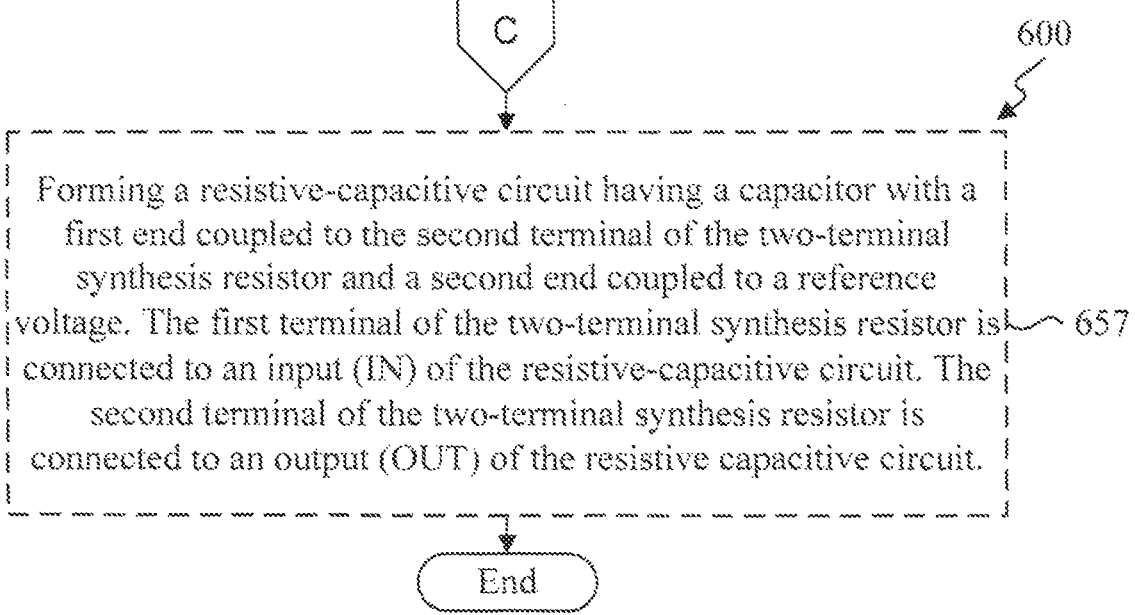

While two-terminal synthesis resistor 100 of FIG. 1 is shown cascaded for illustrative purposes, in other aspects one of the other two-terminal synthesis resistor described herein, or a mix of any of two-terminal synthesis resistor 100 of FIG. 1, two-terminal synthesis resistor 400 of FIG. 4, and two-terminal synthesis resistor 500 of FIG. 5, may be cascaded, with the caveat that only the first stage incudes resistor R 102, 402, 502.

In an aspect, an even number of stages are connected in series to match and maintain the direction of voltage and current. That is, for each "pair" of stages, one stage of the pair will provide a current direction at its input that (i) opposes the other current direction at the input of the other stage of the pair and (ii) matches the other current direction at the output of the other stage, as shown by the horizontal arrows and their respective thicknesses corresponding to their relative current magnitudes.

Figure 3:
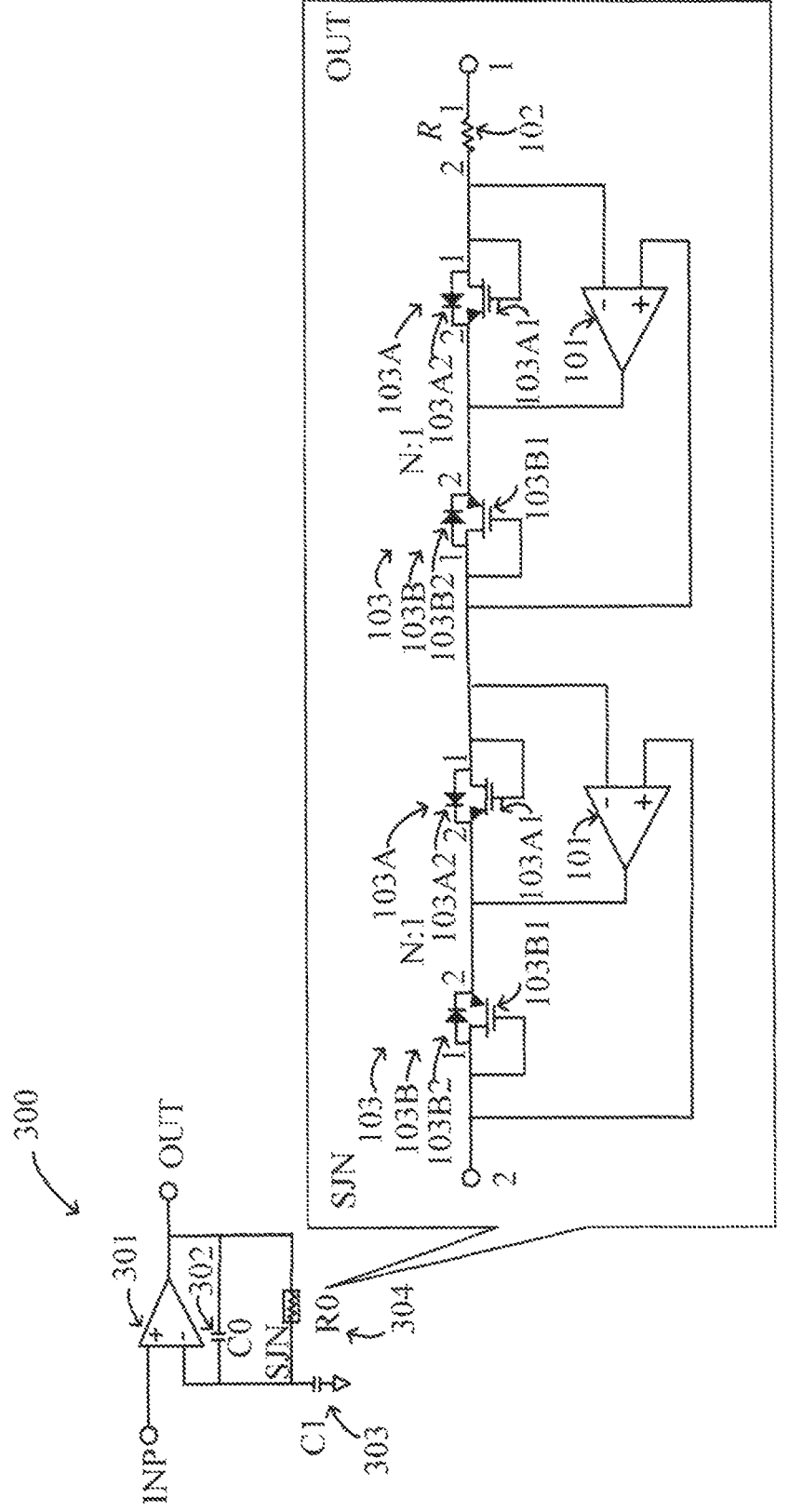
FIG. 3 is a schematic diagram of an example non-inverting amplifier circuit that uses the synthesis resistor as a feedback element, in accordance with an example aspect.

Referring to FIG. 3, an example non-inverting amplifier circuit 300 that uses the synthesis resistor as a feedback element is shown, in accordance with an example aspect.

The gain of an inverting amplifier is determined from the resistor values, namely that of R and Rf, where Rf is the feedback or two-terminal synthesis resistor. The higher the resistance value of Rf, the higher the gain of the inverting amplifier. Hence, any applications requiring a very high gain or high input impedance can use the proposed two-terminal synthesis resistors described herein. Moreover, by using the synthesis resistor, a large time constant can be obtained (due to the large resistance), thus extending the bandwidth of non-inverting amplifier circuit 300 to lower frequencies.

Initially, a description of the top-level components (op amp, current mirror, two-terminal synthesis resistor, and two capacitors) is provided, followed by a further description of the connections of these elements and any further constituent components.

The non-inverting amplifier 300 includes an operational amplifier (op amp) 301, a capacitor C0 302, a capacitor C1 303 and a two-terminal synthesis resistor R0 304, which may be any of the two-terminal synthesis resistors described herein.

A non-inverting input of the op amp 301 is configured to receive an input INP. The capacitor 302 is connected across the output OUT and inverting input of the op amp 301, the synthesis resistor R0 304 is connected in parallel to the capacitor C0 302 in being across the output OUT and inverting input of the op amp 301. The capacitor C1 303 is connected to the inverting input of the op amp 301 and a reference voltage (e.g., ground).

The two-terminal synthesis resistor R0 304 may be any of the two-terminal synthesis resistors shown herein, including two-terminal synthesis resistor 100 of FIG. 1, two-terminal synthesis resistor 400 of FIG. 4, and two-terminal synthesis resistor 500 of FIG. 5, as well as variations thereof as contemplated by one of ordinary skill in the art given the teachings of the present disclosure provided herein.

In the non-inverting amplifier circuit 300 of FIG. 3, there are no restrictions on the potential of either terminal of the two-terminal synthesis resistor R0 304. The two-terminal synthesis resistor R0 304, in having two terminals, can be used (configured) like an actual resistor.

Referring to FIG. 4, another example two-terminal synthesis resistor 400 is shown, in accordance with an example aspect. The two-terminal synthesis resistor 400 FIG. 4 differs from the two-terminal synthesis resistor 100 of FIG. 1 in the connection of the gates of the respective two transistors (103A1/403A1 and 103B1/403B1) that form the current mirrors 103 and 403. The reason for the different gate wiring is that the offset of the op amp (101/401) has a different effect on the VGS's of the two transistors ((103A1 and 103B1) versus (403A1 and 403B1)). The two-terminal synthesis resistor 400 has less influence of the offset voltage on the DC operating point than the two-terminal synthesis resistor 100. However, the two-terminal resistor 100 would be better for Alternating Current (AC) operation.

To further describe the differences, consider the offset voltage $V_{off}$ of the op amp (101/401) to correspond to a voltage source having a negative terminal connected to the negative terminal of the op amp (101/401) and a positive terminal connected to the output node having the output voltage $V_{out}$. Referring to FIGS. 1 and 4, the VGS of transistor 103B1 increases by $V_{off}$, while the VGS of transistor 103A1 remains unchanged. As a result, the ratio of the resistance of transistor 103A1 and transistor 103B1 deviate from 1:1/N.

In FIG. 4, the sources of transistor 403A1 and transistor 403B1 are connected together. The same is true for the gates. Therefore, both VGS's (of transistor 403A1 and transistor 403B1) will be the same. Thus, even if there is an offset in the op amp 401, the ratio of the resistance of transistor 403A1 and transistor 403B1 is maintained at 1:1/N.

Although the VDS of transistor 403A1 and transistor 403B1 differ by $V_{off}$, the resistance of the transistor 403A1 and transistor 403B1 is insensitive to VDS to a first-order approximation.

Regarding AC operation, there is a difference in the gate-source capacitance Cgs of the transistor 103B1 or 403B1. The gate of the transistor 103B1 is shorted to the drain, so the AC current through CGS flows out to terminal 2 on the right side. On the other hand, the current in the CGS of the transistor 403B1 has no path to flow to terminal 2 on the right side.

In this respect, FIG. 1 has better symmetry of the two transistors 103A1 and 103B1 (mirror symmetry with respect to the source).

Initially, a description of the top-level components (op amp, current mirror having two transistor circuits, and resistor) is provided, followed by a further description of the connections of these elements and any further constituent components.

The two-terminal synthesis resistor 400 includes an operational amplifier ("op amp") 401, a resistor R 402, and a current mirror 403 formed from a first transistor circuit 403A and a second transistor circuit 403B. The two-terminal synthesis resistor 400 connects to an input voltage $V_{in}$ to provide an output voltage $V_{out}$. The first transistor circuit 403A can be considered to be a first side of the current mirror 403, and the second transistor circuit 403B can be considered to be a second side of the current mirror 403. The preceding circuit elements including, for example, op amp 401 and the negative-feedback circuit formed from the first transistor circuit 403A (i.e., the first side of the current mirror 403), enable the potential of one terminal or both terminals of the two-terminal synthesis resistor 400 to be reflected in the current by virtue of the virtual short that exists between the inputs of op amp 401.

The first transistor circuit 403A includes a first MOSFET 403A1 and a first diode 403A2. The second transistor circuit 403B includes a second MOSFET 403B1 and a second diode 403B2.

The first MOSFET 403A1 includes a gate terminal connected to a first non-gate terminal of MOSFET 403A1, an inverting input terminal of the op amp 101, an input of first diode 403A2, a gate terminal of second MOSFET 403B1, and a second side of resistor R 402. A first side of resistor R 402 is connected to input voltage $V_{in}$.

The second MOSFET 103B1 includes a first non-gate terminal connected to a non-inverting input terminal of the op amp 101, an input of second diode 103B, and output voltage $V_{out}$.

The MOSFET 403A1 has a second non-gate terminal connected to an output of the op amp 401, a second non-gate terminal of MOSFET 403B1, an output of first diode 403B1, and an output of second diode 403B2.

The two-terminal synthesis resistor 400 copies the output voltage $V_{out}$ to the right end of resistor R 402 by a virtual short-circuit 499.

The VDS of both MOSFET 403A1 and MOSFET 403B1 are kept the same.

The input current, $i_n$, flowing through resistor R 420 is determined as follows:

$$i_n = \frac{V_{in} - V_{out}}{R}$$

The output current, $i_{out}$, is proportional to $V_{in}$-$V_{out}$ as follows:

$$i_{out} = -\frac{i_{in}}{N} = -\frac{V_{in} - V_{out}}{NR}$$

Referring to FIG. 5, yet another example two-terminal synthesis resistor 500 is shown, in accordance with an example aspect. The two-terminal synthesis resistor 500 of FIG. 5 differs from the two-terminal synthesis resistor 100 of FIG. 1 in the connection of the gate of the transistor circuit 503B and the addition of two additional transistors 503A, 503C that form the current mirror 503. Another difference is the lack of diodes in the two-terminal synthesis resistor 500 compared to two-terminal synthesis resistor 100. The two-terminal synthesis resistor 500 of FIG. 5 was designed to eliminate the effect of $V_{GS}$ so that the channel conduction of the FETs (503A-D) takes place regardless of which direction current flows. The current path in two-terminal synthesis resistor 500 is the channel of the MOS-FET when current flows out of terminal 1 of two-terminal synthesis resistor 500, and the diode when current flows into terminal 1 of two-terminal synthesis resistor 500 from the outside. In the case of channel conduction, the ratio of resistance values can be accurately determined due to the matching of the $V_{GS}$. On the other hand, in the case of diode conduction, the effect of offset voltage cannot be avoided. Initially, a description of the top-level components (op amp, current mirror having four transistor circuits, and resistor) is provided, followed by a further description of the connections of these elements and any further constituent components.

The two-terminal synthesis resistor 500 includes an operational amplifier ("op amp") 501, a resistor R 502, and a current mirror 503 formed from a first transistor circuit 503A, a second transistor circuit 503B, a third transistor circuit 503C, and a fourth transistor circuit 503D. The two-terminal synthesis resistor 500 connects to an input voltage $V_{in}$ to provide an output voltage $V_{out}$. The first transistor circuit 503A and third transistor circuit 503C can be considered to be a first side of the current mirror 503, and the second transistor circuit 503B and the fourth transistor circuit 503D can be considered to be a second side of the current mirror 503. The preceding circuit elements including, for example, op amp 105 and the negative-feedback circuit formed from the first transistor 503A and the second transistor 503B (i.e., the first side of the current mirror 503), enable the potential of one terminal or both terminals of the two-terminal synthesis resistor 500 to be reflected in the current by virtue of the virtual short that exists between the inputs of op amp 501.

The first transistor 503A, the second transistor 503B, the third transistor 503C, and the fourth transistor 503D are connected at a common node to an output of the op amp 501

A gate of the first transistor 503A, a gate of the second transistor 503B, a gate of the third transistor 503C, and a gate of the fourth transistor 503D are connected to a first non-gate terminal of the first transistor 503A, a first non-gate terminal of the third transistor 503C, a second side of the resistor R 502, and an inverting input of the op amp 501. A first side of resistor R 502 is connected to input voltage $V_{in}$.

The second transistor 503C includes a first non-gate terminal connected to a first non-gate terminal of the fourth transistor 503D, a non-inverting input terminal of the op amp 101, and output voltage $V_{out}$.

The two-terminal synthesis resistor 500 copies the output voltage $V_{out}$ to right end of resistor R 502 by a virtual short-circuit 599.

The VDS of MOSFET 503A1, MOSFET 503B1, MOSFET 503C1, and MOSFET 503D1 are kept the same.

The input current, $i_n$, flowing through resistor R 520 is determined as follows:

$$i_n = \frac{V_{in} - V_{out}}{R}$$

The output current, $i_{out}$, is proportional to $V_{in}-V_{out}$ as follows:

$$i_{out} = -\frac{i_{in}}{N} = -\frac{V_{in} - V_{out}}{NR}$$

Referring to FIGS. 6-9, an example method 600 for forming a two-terminal synthesis resistor is shown, in accordance with an example aspect. Blocks 610-656 of method 600 pertain to FIGS. 1-5. Block 657 pertains to FIG. 11.

At block 610, the method 600 includes configuring a current mirror 103, 403, 503 to have a first side a first transistor 103A, 403A, 503A/503B, and a second side with a second transistor 103B, 403B, 503C/503D, the first side of the current mirror and the second side of the current mirror connected to a common node 181, 481, 581 that is also connected to an output of an operational amplifier (op amp) 101, 401, 501. Block 610 provides the current mirror 103, 403, 503. A first side of the current mirror 103, 403, 503 is used in the negative feedback loop of the op amp 101, 401, 501. In this way, a virtual short is formed between the output of the second side of the current mirror 103, 403, 503 (that is, between the non-inverting terminal of the op amp 101, 401, 501 (which is connected to the output of the second side of the current mirror 103, 403, 503, thus being the same node)) and the inverting terminal of the op amp 101, 401, 501. The first side of the current mirror 103, 403, 503 essentially forms a resistance Rf from which a gain of the op amp 101, 401, 501 is determined. The actual gain involves Rin in the denominator.

At block 620, the method 600 includes configuring a resistor 102, 402, 502 to have a first side configured to be a first terminal of the two-terminal synthesis resistor 100, 400, 500, and a second side connected to an inverting input of the op amp 101, 401, 501, and the first transistor 103A, 403A, 503A/503B. The resistor 102, 402, 502 provides a resistor Rin from which a gain of the op amp 101, 401, 501 is determined. The actual gain involves Rf in the numerator.

At block 630, the method 600 includes configuring a second terminal of the two-terminal synthesis resistor 100, 400, 500 to be connected to the second transistor 103B, 403B, 503C/D, and a non-inverting input of the op amp 101, 401, 501. Block 630 establishes the second terminal of the resistor in relation to the current mirror 103, 403, 503 and op amp 101, 401, 501 in order to establish the virtual short described above.

In various aspects, method 600 may include one or more of block 641-block 656.

At block 641, the method 600 includes configuring the first transistor 103A1, 403A1 and the second transistor 103B1, 403B1 to have a same power supply voltage value. See at least FIGS. 1 and 4.

At block 642, the method 600 includes configuring a first diode 103A2, 403A2 to be connected across non-gate terminals of the first transistor 103A1, 403A1, and a second diode 103B2, 403B2 to be connected across non-gate terminals of the second transistor 103B1 403B1. See at least FIGS. 1 and 4.

At block 643, the method 600 includes configuring a first diode 103A2, 403A2 to be connected across a first non-gate terminal and a second non-gate terminal of the first transistor 103A, 403A and a second diode 103B2, 403B2 to be connected across the first non-gate terminal and a second non-gate terminal of the second transistor 103B1, 403B1. See at least FIGS. 1 and 4.

At block 644, the method 600 includes configuring an input side of a first diode 103A2 to be connected to a first non-gate terminal and a gate of the first transistor 103A1. See at least FIG. 1.

At block 645, the method 600 includes configuring an input side of a second diode 103B2 to be connected to the first non-gate terminal and a gate of the second transistor 403B1, and configuring an output side of the first diode and the output side of the second diode 103B2 to be connected to the common node 181. See at least FIG. 1.

At block 646, the method 600 includes configuring the common node 181 to be connected to a second non-gate terminal of the first transistor 103A1, a second non-gate terminal of the second transistor 103B1, and an output of the op amp 101. See at least FIG. 1.

At block 647, the method 600 includes configuring the second terminal of the two-terminal synthesis resistor 100 to be connected to a gate of the second transistor 103B1, a first non-gate terminal of the second transistor 103B1, the non-inverting input of the op amp 101. See at least FIG. 1.

At block 648, the method includes connecting a second terminal of the two-terminal synthesis resistor 400 to a first non-gate terminal of the second transistor 403B1, and a non-inverting input of the op amp 401. See at least FIG. 4.

At block 649, the method 600 includes connecting the second side of the resistor 402 to a gate of the first transistor 403A1 and a gate of the second transistor 403B1. See at least FIG. 4.

At block 650, the method 600 includes connecting a gate of the first transistor 503A to a gate of the second transistor 503B, a gate of the third transistor 503C, and a gate of the fourth transistor 503D. See at least FIG. 5.

At block 651, the method 600 includes connecting the gate of the first transistor 503A, the gate of the second transistor 503B, the gate of the third transistor 503C, and the gate of the fourth transistor 503D to the second side of the resistor 502, the inverting input of the op amp 501, and the first transistor 503A. See at least FIG. 5.

At block 652, the method 600 incudes connecting a first non-gate terminal of the first transistor 503A to a first non-gate terminal of the third transistor 503C, the second side of the resistor 502, the inverting input of the op amp 501, the gate of the first transistor 503A, the gate of the second transistor 503B, the gate of the third transistor 503C, and the gate of the fourth transistor 503D. See at least FIG. 5.

At block 653, the method 600 includes configuring a second non-gate terminal of the first transistor 503A, a second non-gate terminal of the second transistor 503B, a second non-gate terminal of the third transistor 503C, and a second non-gate terminal of the fourth transistor 503D to be connected to the common node 581 and the output of the op amp 501. See at least FIG. 5.

At block 654, the method 600 includes configuring the op amp 101, the current mirror 103, the resistor 102, and the output node to form a two-terminal synthesis resistor stage 201 in a plurality of cascaded two-terminal synthesis resistors 201, 202. Only a first one 201 of the plurality of cascaded two-terminal resistors 201, 202 includes the resistor 102 and remaining ones 202 of the plurality of cascaded two-terminal synthesis resistors 201, 202 and omits the resistor 102. See at least FIG. 2.

At block 655, the method 600 includes configuring an output node of a preceding one 211 of a plurality of cascaded two-terminal synthesis resistors 211, 212 to be connected to an input node of a next one 212 of the plurality of cascaded two-terminal synthesis resistors 211, 212. See at least FIG. 2.

At block 656, the method 600 includes configuring the plurality of cascaded two-terminal synthesis resistors to include an even number of stages to combine a current having a current direction from one stage 221 of a plurality of cascaded two-terminal synthesis resistors 221, 222 with a current having an opposing direction from a next stage 222 of the plurality of cascaded two-terminal synthesis resistors 221, 222. See at least FIG. 2.

At block 657, the method 600 includes forming a resistive-capacitive circuit 1100 having a capacitor $C_1$ 1101 with a first end coupled to the second terminal of the two-terminal synthesis resistor $R_0$ 1102 and a second end coupled to a reference voltage. The first terminal of the two-terminal synthesis resistor R0 1102 is connected to an input (IN) of the resistive-capacitive circuit 1100. The second terminal of the two-terminal synthesis resistor R0 1102 is connected to an output (OUT) of the resistive capacitive circuit. See at least FIG. 11.

Thus, method 600 provides one or more two-terminal synthesis resistors (in series) as described herein that have a resistance value in tera ohms, thus being applicable for any high resistance/high impedance applications.

Referring to FIG. 10, an example method 1000 for forming a non-inverting amplifier circuit is shown, in accordance with an example aspect. Blocks 1010-1040 of method 1000 pertain to at least FIG. 3. FIG. 3 includes, for illustrative sake, two-terminal synthesis resistor 100. The two-terminal synthesis resistor 100 in FIG. 3 may be ready replaced by one of more of the two-terminal synthesis resistor 400 of FIG. 5 and the two-terminal synthesis resistor 500 of FIG. 5.

At block 1010, the method 1000 includes configuring a two-terminal synthesis 304 resistor to be connected across a non-inverting input of a first operational amplifier 301 (op amp) and an output of the first op amp 301.

At block 1020, the method 1000 includes configuring the two-terminal synthesis resistor 304 to include a resistor 102, a second op amp 101, and a current mirror 103 having a first side with a first transistor 103A1 and a second side with a second transistor 103B1, the first side of the current mirror 103 and the second side of the current mirror connected 103 to a common node 181 that is also connected to an output of the second op amp 101.

At block 1030, the method 1000 includes configuring the resistor 102 to have a first side configured to be a first terminal of the two-terminal synthesis resistor 304, and a second side connected to a non-inverting input of the op amp 101 and the first transistor 103A1.

At block 1040, the method 1000 includes configuring a second terminal of the two-terminal synthesis resistor 304 to be connected to the second transistor 103B1 and a non-inverting input of the first op amp 101.

The method 1000 may include one or more of blocks 1041 and 1042.

At block 1041, the method 1000 includes configuring a capacitor C0 302 to be connected across the two-terminal synthesis resistor 304. See FIG. 3.

At block 1042, the method 1000 includes configuring another capacitor C1 303 having a first side to be connected to the non-inverting input of the first op amp 101 and a second side to be connected to a reference voltage. See FIG. 3.

Thus, method 1000 provides a non-inverting amplifier circuit having a two-terminal synthesis resistor arranged in a negative feedback path as described herein to provide a resistance in the tera ohms, thus being applicable for any amplifier amplification involving high resistance/high impedance in the amplifier circuit.

Figure 11:
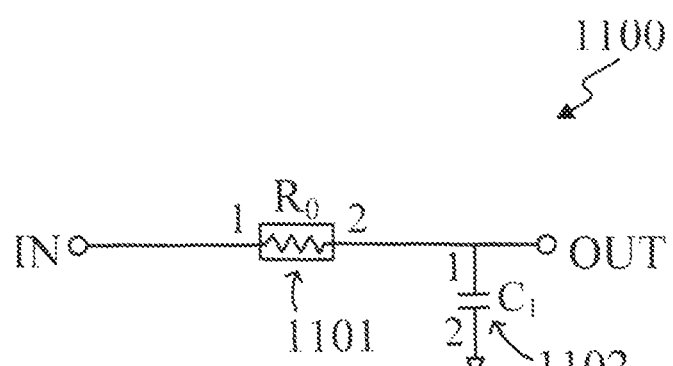
FIG. 11 is a block diagram of an example resistive-capacitive circuit, in accordance with an example aspect.

Referring to FIG. 11, an example resistive-capacitive circuit 1100 formed from a two-terminal synthesis resistor is shown, in accordance with an example aspect.

The resistive-capacitive circuit 1100 has a capacitor C1 1101 with a first end coupled to the second terminal of the two-terminal synthesis resistor R0 1102 and a second end coupled to a reference voltage. The first terminal of the two-terminal synthesis resistor R0 1102 is connected to an input (IN) of the resistive-capacitive circuit 1100. The second terminal of the two-terminal synthesis resistor R0 1102 is connected to an output (OUT) of the resistive capacitive circuit.

It is to be appreciated that in other aspects, the positions of the two-terminal synthesis resistor R0 1102 and the capacitor may be reversed, that is, each may occupy the other's place in the circuit.

Resistive-capacitive circuit 1100 may be used as the negative feedback loop in the non-inverting amplifier circuit 300 of FIG. 3. Use of the two-terminal synthesis resistor and its accompanying large terra ohm resistance in the resistive-capacitive circuit 1100 obtain a large time constant with a small capacitance. Also, the resistive-capacitive circuit 1100 will have less those than if conventional resistors of the same value are used in place of the synthesis resistor.

RC circuits are often used for signal filtering. For an RC circuit, the frequency $$f = \frac{1}{2\pi RC}.$$

Thus, increasing the resistance to high values as achievable by the two-terminal synthesis resistor will enable the filtering of very low frequencies that previously required a large area of resistive material now replaced by the two-terminal synthesis resistor as described herein. It is to be appreciated that two-terminal synthesis resistor $R_0$ 1102 can be used in any application where it is desirable that the voltage at either terminal of the synthesis resistor be reflected in the current through the synthesis resistor. That is, the voltages at the two terminals of two-terminal synthesis resistor $R_0$ 1102 can be independently varied.

Additional aspects of the present disclosure may include one or more of the following clauses.

Clause 1 An amplifier circuit, comprising: a first operational amplifier (op amp); a two-terminal synthesis resistor connected across a non-inverting input of the first op amp and an output of the first op amp, the two-terminal synthesis resistor comprising: a second op amp; a current mirror having a first transistor, a second transistor, and a common node connected to the first transistor, the second transistor, and an output of the second op amp; a resistor having a first side configured to be a first terminal of the two-terminal synthesis resistor, and a second side connected to an inverting input of the second op amp, and the first transistor; and a second terminal of the two-terminal synthesis resistor connected to the second transistor, and a non-inverting input of the second op amp.

Clause 2. The amplifier circuit in accordance with clause 1, wherein a virtual short between the inverting input of the op amp and the non-inverting input of the op amp causes a voltage at the second side of the resistor to be equal to an output voltage taken from the second terminal of the two-terminal synthesis resistor.

Clause 3. The amplifier circuit in accordance with any preceding clause, wherein an input to the two-terminal synthesis resistor and an output from the two-terminal synthesis resistor are respectively applied to the first side and the second side of the resistor.

Clause 4. The amplifier circuit in accordance with any preceding clause, wherein an output current $i_{out}$ from the second terminal of the two-terminal resistor is proportional to a difference between an input voltage $V_{in}$ applied to the first terminal of the two-terminal synthesis resistor and an output voltage $V_{out}$ measured from the second terminal of the two-terminal synthesis resistor.

Clause 5. The amplifier circuit in accordance with any preceding clause, wherein the output current out from the second terminal of the two-terminal synthesis resistor is calculated as follows:

$$i_{out} = -\frac{i_{in}}{N} = -\frac{V_{in} - V_{out}}{NR},$$

wherein $i_{in}$ is a current through the resistor, R is a resistance of the resistor, and N is a multiplier between die or transistor sizes of 103A1 versus 103B.

Clause 6. The amplifier circuit in accordance with any preceding clause, wherein the first transistor and the second transistor are configured to have a same power supply voltage value.

Clause 7. The amplifier circuit in accordance with any preceding clause, wherein a first diode is connected across non-gate terminals of the first transistor, and a second diode is connected across non-gate terminals of the second transistor.

Clause 8. The amplifier circuit in accordance with any preceding clause, wherein a first diode is connected across a first non-gate terminal and a second non-gate terminal of the first transistor, and a second diode is connected across the first non-gate terminal and a second non-gate terminal of the second transistor.

Clause 9. The amplifier circuit in accordance with any preceding clause, wherein an input side of a first diode is connected to a first non-gate terminal and a gate of the first transistor, wherein an input side of a second diode is connected to the first non-gate terminal and a gate of the second transistor, and wherein an output side of the first diode and the output side of the second diode are connected to the common node.

Clause 10. The amplifier circuit in accordance with any preceding clause, wherein the common node is connected to a second non-gate terminal of the first transistor, a second non-gate terminal of the second transistor, and an output of the op amp.

Clause 11. The amplifier circuit in accordance with any preceding clause, wherein a second terminal of the two-terminal synthesis resistor is connected to a gate of the second transistor, a first non-gate terminal of the second transistor, and a non-inverting input of the op amp.

Clause 12. The amplifier circuit in accordance with any preceding clause, wherein a second terminal of the two-terminal synthesis resistor is connected to a first non-gate terminal of the second transistor, and a non-inverting input of the op amp.

Clause 13. The amplifier circuit in accordance with any preceding clause, wherein the second side of the resistor is further connected to a gate of the first transistor and a gate of the second transistor.

Clause 14. The two-terminal synthesis resistor in accordance with any preceding clause, wherein a first side of the current mirror has the first transistor and a third transistor, a second side of the current mirror has the second transistor and a fourth transistor, and wherein a gate of the first transistor, a gate of the second transistor, a gate of the third transistor, and a gate of the fourth transistor are connected together.

Clause 15. The amplifier circuit in accordance with any preceding clause, wherein the gate of the first transistor, the gate of the second transistor, the gate of the third transistor, and the gate of the fourth transistor are connected to the second side of the resistor, the inverting input of the op amp, and the first transistor.

Clause 16. The amplifier circuit in accordance with any preceding clause, wherein a first non-gate terminal of the first transistor is connected to a first non-gate terminal of the third transistor, the second side of the resistor, the inverting input of the op amp, the gate of the first transistor, the gate of the second transistor, the gate of the third transistor, and the gate of the fourth transistor.

Clause 17. The amplifier circuit in accordance with any preceding clause, wherein a second non-gate terminal of the first transistor, a second non-gate terminal of the second transistor, a second non-gate terminal of the third transistor, and a second non-gate terminal of the fourth transistor are connected to the common node and the output of the op amp.

Clause 18. The amplifier circuit in accordance with any preceding clause, wherein the op amp, the current mirror, the resistor, and the output node are configured to form a two-terminal synthesis resistor stage in a plurality of cascaded two-terminal synthesis resistors, wherein only a first one of the plurality of cascaded two-terminal resistors includes the resistor and remaining ones of the plurality of cascaded two-terminal synthesis resistors omit the resistor.

Clause 19. The amplifier circuit in accordance with any preceding clause, wherein the output node of a preceding one of the plurality of cascaded two-terminal synthesis resistors is connected to an input node of a next one of the plurality of cascaded two-terminal synthesis resistors.

Clause 20. The amplifier circuit in accordance with any preceding clause, wherein the plurality of cascaded two-terminal synthesis resistors comprise an even number of stages to combine a current having a current direction from one stage of the plurality of cascaded two-terminal synthesis resistors with a current having an opposing direction from a next stage of the plurality of cascaded two-terminal synthesis resistors.

Clause 21. The amplifier circuit in accordance with any preceding clause, further comprising a capacitor connected across the two-terminal synthesis resistor.

Clause 22. The amplifier circuit in accordance with any preceding clause, further comprising another capacitor having a first side connected to the non-inverting input of the first op amp and a second side connected to a reference voltage.

Clause 23. A method for forming an amplifier circuit, comprising: configuring a two-terminal synthesis resistor to be connected across a non-inverting input of a first operational amplifier (op amp) and an output of the first op amp; configuring the two-terminal synthesis resistor to include a resistor, a second op amp, and a current mirror having a first side with a first transistor and a second side with a second transistor, the first side of the current mirror and the second side of the current mirror connected to a common node that is also connected to an output of the second op amp; configuring the resistor to have a first side configured to be a first terminal of the two-terminal synthesis resistor, and a second side connected to an inverting input of the op amp, the first transistor; and configuring a second terminal of the two-terminal synthesis resistor to be connected to the second transistor and a non-inverting input of the first op amp.

Clause 24. The method in accordance with clause 23, wherein a virtual short between the inverting input of the op amp and the non-inverting input of the op amp causes a voltage at the second side of the resistor to be equal to an output voltage taken from the second terminal of the two-terminal synthesis resistor.

Clause 25. The method in accordance with any preceding clause, wherein an input to the two-terminal synthesis resistor and an output from the two-terminal synthesis resistor are respectively applied to the first side and the second side of the resistor.

Clause 26. The method in accordance with any preceding clause, further comprising configuring an output current $i_{out}$ from the second terminal of the two-terminal resistor to be proportional to a difference between an input voltage $V_{in}$ applied to the first terminal of the two-terminal synthesis resistor and an output voltage $V_{out}$ measured from the second terminal of the two-terminal synthesis resistor.

Clause 27. The method in accordance with any preceding clause, wherein the output current $i_{out}$ from the second terminal of the two-terminal synthesis resistor is calculated as follows:

$$i_{out} = -\frac{i_{in}}{N} = -\frac{V_{in} - V_{out}}{NR},$$

wherein $i_{in}$ is a current through the resistor, R is a resistance of the resistor, and N is a multiplier between die or transistor sizes of 103A1 versus 103B.

Clause 28. The method in accordance with any preceding clause, further comprising configuring the first transistor and the second transistor to have a same power supply voltage value.

Clause 29. The method in accordance with any preceding clause, further comprising configuring a first diode to be connected across non-gate terminals of the first transistor, and a second diode to be connected across non-gate terminals of the second transistor.

Clause 30. The method in accordance with any preceding clause, further comprising configuring a first diode to be connected across a first non-gate terminal and a second non-gate terminal of the first transistor, and a second diode to be connected across the first non-gate terminal and a second non-gate terminal of the second transistor.

Clause 31. The method in accordance with any preceding clause, further comprising:

configuring an input side of a first diode to be connected to a first non-gate terminal and a gate of the first transistor;

configuring an input side of a second diode to be connected to the first non-gate terminal and a gate of the second transistor; and configuring an output side of the first diode and the output side of the second diode to be connected to the common node.

Clause 32. The method in accordance with any preceding clause, further comprising configuring the common node to be connected to a second non-gate terminal of the first transistor, a second non-gate terminal of the second transistor, and an output of the op amp.

Clause 33. The method in accordance with any preceding clause, further comprising configuring the second terminal of the two-terminal synthesis resistor to be connected to a gate of the second transistor, a first non-gate terminal of the second transistor, the non-inverting input of the op amp.

Clause 34. The method in accordance with any preceding clause, further comprising connecting a second terminal of the two-terminal synthesis resistor to a first non-gate terminal of the second transistor, and a non-inverting input of the op amp.

Clause 35. The method in accordance with any preceding clause, further comprising connecting the second side of the resistor to a gate of the first transistor and a gate of the second transistor.

Clause 36. The method in accordance with any preceding clause, wherein a first side of the current mirror has the first transistor and a third transistor, a second side of the current mirror has the second transistor and a fourth transistor, and wherein the method further includes connecting a gate of the first transistor to a gate of the second transistor, a gate of the third transistor, and a gate of the fourth transistor.

Clause 37. The method in accordance with any preceding clause, further comprising connecting the gate of the first transistor, the gate of the second transistor, the gate of the third transistor, and the gate of the fourth transistor to the second side of the resistor, the inverting input of the op amp, and the first transistor.

Clause 38. The method in accordance with any preceding clause, further comprising connecting a first non-gate terminal of the first transistor to a first non-gate terminal of the third transistor, the second side of the resistor, the inverting input of the op amp, the gate of the first transistor, the gate of the second transistor, the gate of the third transistor, and the gate of the fourth transistor.

Clause 39. The method in accordance with any preceding clause, further comprising configuring a second non-gate terminal of the first transistor, a second non-gate terminal of the second transistor, a second non-gate terminal of the third transistor, and a second non-gate terminal of the fourth transistor to be connected to the common node and the output of the op amp.

Clause 40. The method in accordance with any preceding clause, further comprising configuring the op amp, the current mirror, the resistor, and the output node to form a two-terminal synthesis resistor stage in a plurality of cascaded two-terminal synthesis resistors, wherein only a first one of the plurality of cascaded two-terminal resistors includes the resistor and remaining ones of the plurality of cascaded two-terminal synthesis resistors omit the resistor.

Clause 41. The method in accordance with any preceding clause, further comprising configuring an output node of a preceding one of the plurality of cascaded two-terminal synthesis resistors to be connected to an input node of a next one of the plurality of cascaded two-terminal synthesis resistors.

Clause 42. The method in accordance with any preceding clause, further comprising configuring the plurality of cascaded two-terminal synthesis resistors to include an even number of stages to combine a current having a current direction from one stage of the plurality of cascaded two-terminal synthesis resistors with a current having an opposing direction from a next stage of the plurality of cascaded two-terminal synthesis resistors.

Clause 43. The method in accordance with any preceding claim 23, further comprising configuring a capacitor to be connected across the two-terminal synthesis resistor.

Clause 44. The method in accordance with any preceding clause, further comprising configuring another capacitor having a first side to be connected to the non-inverting input of the first op amp and a second side to be connected to a reference voltage.

Clause 45. The method in accordance with any preceding clause 44, further comprising configuring a capacitor to be connected across the two-terminal synthesis resistor.

Clause 46. The method in accordance with any preceding clause, further comprising configuring another capacitor having a first side to be connected to the non-inverting input of the first op amp and a second side to be connected to a reference voltage.

The flowchart and block diagrams in the Figures illustrate the architecture, functionality, and operation of possible implementations of systems, methods, and computer program products according to various aspects of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that all of the specifications, dimensions, and relationships outlined herein (e.g., the number of elements, operations, steps, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example aspects have been described with reference to particular component arrangements. Various modifications and changes may be made to such aspects without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system may be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and may accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one aspect", "example aspect", "an aspect", "another aspect", "some aspects", "various aspects", "other aspects", "alternative aspect", and the like are intended to mean that any such features are included in one or more aspects of the present disclosure, but may or may not necessarily be combined in the same aspects.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by aspects described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more aspects.

The "means for" in these instances (above) may include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIG-URES (and their teachings) are readily scalable and may accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, aspects described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims; and (b) does not intend, by any statement in the specification, to limit this disclosure in any way that is not otherwise reflected in the appended claims.

The invention claimed is:

1. An amplifier circuit, comprising:
   a first operational amplifier (op amp);
   a two-terminal synthesis resistor connected across a non-inverting input of the first op amp and an output of the first op amp, the two-terminal synthesis resistor comprising:
      a second op amp;
      a current mirror having a first transistor, a second transistor, and a common node connected to the first transistor, the second transistor, and an output of the second op amp;
      a resistor having a first side configured to be a first terminal of the two-terminal synthesis resistor, and a second side connected to an inverting input of the second op amp, and the first transistor; and
      a second terminal of the two-terminal synthesis resistor connected to the second transistor, and a non-inverting input of the second op amp.

2. The amplifier circuit in accordance with claim 1, wherein a virtual short between the inverting input of the op amp and the non-inverting input of the op amp causes a voltage at the second side of the resistor to be equal to an output voltage taken from the second terminal of the two-terminal synthesis resistor.

3. The amplifier circuit in accordance with claim 2, wherein an input to the two-terminal synthesis resistor and an output from the two-terminal synthesis resistor are respectively applied to the first side and the second side of the resistor.

4. The amplifier circuit in accordance with claim 1, wherein an output current $i_{out}$ from the second terminal of the two-terminal resistor is proportional to a difference between an input voltage $V_{in}$ applied to the first terminal of the two-terminal synthesis resistor and an output voltage $V_{out}$ measured from the second terminal of the two-terminal synthesis resistor.

5. The amplifier circuit in accordance with claim 4, wherein the output current $i_{out}$ from the second terminal of the two-terminal synthesis resistor is calculated as follows:

$$i_{out} = -\frac{i_{in}}{N} = -\frac{V_{in} - V_{out}}{NR},$$

wherein $i_{in}$ is a current through the resistor, R is a resistance of the resistor, and N is a multiplier between die sizes or transistor sizes of different sides of the current mirror.

6. The amplifier circuit in accordance with claim 1, wherein the first transistor and the second transistor are configured to have a same power supply voltage value.

7. The amplifier circuit in accordance with claim 1, wherein a first diode is connected across non-gate terminals of the first transistor, and a second diode is connected across non-gate terminals of the second transistor.

8. The amplifier circuit in accordance with claim 1, wherein a first diode is connected across a first non-gate terminal and a second non-gate terminal of the first transistor, and a second diode is connected across the first non-gate terminal and a second non-gate terminal of the second transistor.

9. The amplifier circuit in accordance with claim 1, wherein an input side of a first diode is connected to a first non-gate terminal and a gate of the first transistor, wherein an input side of a second diode is connected to the first non-gate terminal and a gate of the second transistor, and wherein an output side of the first diode and the output side of the second diode are connected to the common node.

10. The amplifier circuit in accordance with claim 1, wherein the common node is connected to a second non-gate terminal of the first transistor, a second non-gate terminal of the second transistor, and an output of the op amp.

11. The amplifier circuit in accordance with claim 1, wherein a second terminal of the two-terminal synthesis resistor is connected to a gate of the second transistor, a first non-gate terminal of the second transistor, and a non-inverting input of the op amp.

12. The amplifier circuit in accordance with claim 1, wherein a second terminal of the two-terminal synthesis resistor is connected to a first non-gate terminal of the second transistor, and a non-inverting input of the op amp.

13. The amplifier circuit in accordance with claim 1, wherein the second side of the resistor is further connected to a gate of the first transistor and a gate of the second transistor.

14. The amplifier circuit in accordance with claim 1, wherein a first side of the current mirror has the first transistor and a third transistor, a second side of the current mirror has the second transistor and a fourth transistor, and wherein a gate of the first transistor, a gate of the second transistor, a gate of the third transistor, and a gate of the fourth transistor are connected together.

15. The amplifier circuit in accordance with claim 14, wherein the gate of the first transistor, the gate of the second transistor, the gate of the third transistor, and the gate of the fourth transistor are connected to the second side of the resistor, the inverting input of the op amp, and the first transistor.

16. The amplifier circuit in accordance with claim 14, wherein a first non-gate terminal of the first transistor is connected to a first non-gate terminal of the third transistor, the second side of the resistor, the inverting input of the op amp, the gate of the first transistor, the gate of the second transistor, the gate of the third transistor, and the gate of the fourth transistor.

17. The amplifier circuit in accordance with claim 14, wherein a second non-gate terminal of the first transistor, a second non-gate terminal of the second transistor, a second non-gate terminal of the third transistor, and a second non-gate terminal of the fourth transistor are connected to the common node and the output of the op amp.

18. The amplifier circuit in accordance with claim 1, wherein the op amp, the current mirror, the resistor, and the output node are configured to form a two-terminal synthesis resistor stage in a plurality of cascaded two-terminal synthesis resistors, wherein only a first one of the plurality of cascaded two-terminal resistors includes the resistor and remaining ones of the plurality of cascaded two-terminal synthesis resistors omit the resistor.

19. The amplifier circuit in accordance with claim 18, wherein the output node of a preceding one of the plurality of cascaded two-terminal synthesis resistors is connected to an input node of a next one of the plurality of cascaded two-terminal synthesis resistors.

20. The amplifier circuit in accordance with claim 18, wherein the plurality of cascaded two-terminal synthesis resistors comprise an even number of stages to combine a current having a current direction from one stage of the plurality of cascaded two-terminal synthesis resistors with a current having an opposing direction from a next stage of the plurality of cascaded two-terminal synthesis resistors.

21. The amplifier circuit in accordance with claim 1, further comprising a capacitor connected across the two-terminal synthesis resistor.

22. The amplifier circuit in accordance with claim 21, further comprising another capacitor having a first side connected to the non-inverting input of the first op amp and a second side connected to a reference voltage.

23. A method for forming an amplifier circuit, comprising:
configuring a two-terminal synthesis resistor to be connected across a non-inverting input of a first operational amplifier (op amp) and an output of the first op amp;
configuring the two-terminal synthesis resistor to include a resistor, a second op amp, and a current mirror having a first side with a first transistor and a second side with a second transistor, the first side of the current mirror and the second side of the current mirror connected to a common node that is also connected to an output of the second op amp;
configuring the resistor to have a first side configured to be a first terminal of the two-terminal synthesis resistor, and a second side connected to an inverting input of the op amp, the first transistor; and
configuring a second terminal of the two-terminal synthesis resistor to be connected to the second transistor and a non-inverting input of the first op amp.

24. The method in accordance with claim 23, wherein a virtual short between the inverting input of the op amp and the non-inverting input of the op amp causes a voltage at the second side of the resistor to be equal to an output voltage taken from the second terminal of the two-terminal synthesis resistor.

25. The method in accordance with claim 24, wherein an input to the two-terminal synthesis resistor and an output from the two-terminal synthesis resistor are respectively applied to the first side and the second side of the resistor.

26. The method in accordance with claim 23, further comprising configuring an output current $i_{out}$ from the second terminal of the two-terminal resistor to be proportional to a difference between an input voltage $V_{in}$ applied to the first terminal of the two-terminal synthesis resistor and an output voltage $V_{out}$ measured from the second terminal of the two-terminal synthesis resistor.

27. The method in accordance with claim 23, wherein the output current $i_{out}$ from the second terminal of the two-terminal synthesis resistor is calculated as follows:

$$i_{out} = -\frac{i_{in}}{N} = -\frac{V_{in} - V_{out}}{NR},$$

wherein $i_{in}$ is a current through the resistor, R is a resistance of the resistor, and N is a multiplier between die sizes or transistor sizes of different sides of the current mirror.

28. The method in accordance with claim 23, further comprising configuring the first transistor and the second transistor to have a same power supply voltage value.

29. The method in accordance with claim 23, further comprising configuring a first diode to be connected across non-gate terminals of the first transistor, and a second diode to be connected across non-gate terminals of the second transistor.

30. The method in accordance with claim 23, further comprising configuring a first diode to be connected across a first non-gate terminal and a second non-gate terminal of the first transistor, and a second diode to be connected across the first non-gate terminal and a second non-gate terminal of the second transistor.

31. The method in accordance with claim 23, further comprising:

configuring an input side of a first diode to be connected to a first non-gate terminal and a gate of the first transistor;

configuring an input side of a second diode to be connected to the first non-gate terminal and a gate of the second transistor; and configuring an output side of the first diode and the output side of the second diode to be connected to the common node.

32. The method in accordance with claim 23, further comprising configuring the common node to be connected to a second non-gate terminal of the first transistor, a second non-gate terminal of the second transistor, and an output of the op amp.

33. The method in accordance with claim 23, further comprising configuring the second terminal of the two-terminal synthesis resistor to be connected to a gate of the second transistor, a first non-gate terminal of the second transistor, the non-inverting input of the op amp.

34. The method in accordance with claim 23, further comprising connecting a second terminal of the two-terminal synthesis resistor to a first non-gate terminal of the second transistor, and a non-inverting input of the op amp.

35. The method in accordance with claim 23, further comprising connecting the second side of the resistor to a gate of the first transistor and a gate of the second transistor.

36. The method in accordance with claim 23, wherein a first side of the current mirror has the first transistor and a third transistor, a second side of the current mirror has the second transistor and a fourth transistor, and wherein the method further includes connecting a gate of the first transistor to a gate of the second transistor, a gate of the third transistor, and a gate of the fourth transistor.

37. The method in accordance with claim 36, further comprising connecting the gate of the first transistor, the gate of the second transistor, the gate of the third transistor, and the gate of the fourth transistor to the second side of the resistor, the inverting input of the op amp, and the first transistor.

38. The method in accordance with claim 36, further comprising connecting a first non-gate terminal of the first transistor to a first non-gate terminal of the third transistor, the second side of the resistor, the inverting input of the op amp, the gate of the first transistor, the gate of the second transistor, the gate of the third transistor, and the gate of the fourth transistor.

39. The method in accordance with claim 36, further comprising configuring a second non-gate terminal of the first transistor, a second non-gate terminal of the second transistor, a second non-gate terminal of the third transistor, and a second non-gate terminal of the fourth transistor to be connected to the common node and the output of the op amp.

40. The method in accordance with claim 23, further comprising configuring the op amp, the current mirror, the resistor, and the output node to form a two-terminal synthesis resistor stage in a plurality of cascaded two-terminal synthesis resistors, wherein only a first one of the plurality of cascaded two-terminal resistors includes the resistor and remaining ones of the plurality of cascaded two-terminal synthesis resistors omit the resistor.

41. The method in accordance with claim 40, further comprising configuring an output node of a preceding one of the plurality of cascaded two-terminal synthesis resistors to be connected to an input node of a next one of the plurality of cascaded two-terminal synthesis resistors.

42. The method in accordance with claim 40, further comprising configuring the plurality of cascaded two-terminal synthesis resistors to include an even number of stages to combine a current having a current direction from one stage of the plurality of cascaded two-terminal synthesis resistors with a current having an opposing direction from a next stage of the plurality of cascaded two-terminal synthesis resistors.

43. The method in accordance with claim 23, further comprising configuring a capacitor to be connected across the two-terminal synthesis resistor.

44. The method in accordance with claim 43, further comprising configuring another capacitor having a first side to be connected to the non-inverting input of the first op amp and a second side to be connected to a reference voltage.

* * * * *